US012787209B2

(12) United States Patent
Kuo et al.

(10) Patent No.: US 12,787,209 B2
(45) Date of Patent: Nov. 3, 2026

(54) SERVER RACK WITH SERVER MATING LOCATION

(71) Applicant: Dell Products L.P., Round Rock, TX (US)

(72) Inventors: Poshen Kuo, Taipei (TW); Shente Lin, Taipei (TW); Chia-Hung Chou, Taipei (TW)

(73) Assignee: Dell Products L.P., Round Rock, TX (US)

( * ) Notice: Subject to any disclaimer, the term of this patent is extended or adjusted under 35 U.S.C. 154(b) by 91 days.

(21) Appl. No.: 18/953,628

(22) Filed: Nov. 20, 2024

(65) Prior Publication Data

US 2026/0143622 A1 May 21, 2026

(51) Int. Cl.
*H05K 7/14* (2006.01)

(52) U.S. Cl.
CPC .................................. *H05K 7/1492* (2013.01)

(58) Field of Classification Search
CPC ... H01R 12/725; H01R 12/727; H05K 7/1492
See application file for complete search history.

(56) References Cited

U.S. PATENT DOCUMENTS 4,955,020 A * 9/1990 Stone .................... H04J 3/0685 370/360
5,028,809 A * 7/1991 Watanabe .............. H02H 9/004 307/134
5,384,492 A * 1/1995 Carlson .................. H02H 9/004 439/924.1
5,726,506 A * 3/1998 Wood ....................... H02B 1/24 307/64
5,909,065 A * 6/1999 Jones ..................... H02H 9/004 361/791
5,969,938 A * 10/1999 Byrne .................. H05K 7/1457 361/678
6,006,298 A * 12/1999 Satoh ................... H05K 7/1457 713/300
6,293,828 B1 * 9/2001 Colver ................. H05K 7/1457 439/680
6,419,528 B2 * 7/2002 Mullins ................ H01R 4/4863 439/700
6,952,349 B2 * 10/2005 Gough ............... H05K 7/20736 361/755
7,497,709 B1 * 3/2009 Zhang ................ H01R 12/7094 200/51.09

(Continued)

*Primary Examiner* — Adrian S Wilson
(74) *Attorney, Agent, or Firm* — McDermott Will & Schulte LLP

(57) ABSTRACT

A server rack including: rack units; servers, each server positioned within a respective rack unit of the rack units, each server including a first coupling mechanism, each server including a set of switches; a bus bar including, at each rack unit: a second coupling mechanism for coupling with the first coupling mechanism of the server located at the rack unit; a set of tabs, wherein a state of each of the tabs of the set of tabs indicates a location of the rack unit within the server rack, wherein, for each server, the server is positioned within the respective rack unit such that the set of tabs of the bus bar at the respective rack unit contact a subset of the switches of the set of switches of the server to generate a signal by the server that indicates the location of the server within the server rack.

15 Claims, 12 Drawing Sheets

(56) References Cited

U.S. PATENT DOCUMENTS

| | | | | |
|---|---|---|---|---|
| 7,791,865 | B2 * | 9/2010 | Wirtzberger | H05K 7/1457 361/728 |
| 10,020,620 | B2 * | 7/2018 | Yuba | H01R 13/6625 |
| 12,477,677 | B2 * | 11/2025 | Yang | H02M 7/003 |
| 2007/0047180 | A1 * | 3/2007 | Wirtzberger | H05K 7/1457 361/600 |
| 2009/0031051 | A1 * | 1/2009 | Nguyen | G06F 3/0653 710/110 |
| 2012/0075795 | A1 * | 3/2012 | Petruzzo | G06F 1/181 361/679.48 |
| 2014/0277784 | A1 * | 9/2014 | Mick | G06F 1/3206 700/286 |
| 2017/0231108 | A1 * | 8/2017 | Mick | G06F 1/3206 |

* cited by examiner

SERVER RACK WITH SERVER MATING LOCATION

BACKGROUND

Field of the Disclosure

The disclosure relates generally to a server rack, and in particular, a server rack with server mating location.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Server racks are essential components in data centers and IT environments. They provide a structured framework for housing and organizing various IT equipment, such as servers, network switches, storage devices, and power distribution units. These racks are designed to be modular, allowing for easy installation and removal of components. Server racks also incorporate features like cable management systems and ventilation to ensure optimal performance and reliability of the equipment within them.

SUMMARY

Innovative aspects of the subject matter described in this specification may be embodied in a server rack, including a server rack including: a plurality of rack units; a plurality of servers, each server positioned within a respective rack unit of the plurality of rack units, each server including a first coupling mechanism, each server including a set of switches; a bus bar including, at each rack unit of the plurality of rack units: a second coupling mechanism for coupling with the first coupling mechanism of the server located at the rack unit; and a set of tabs, wherein a state of each of the tabs of the set of tabs indicates a location of the rack unit within the server rack, wherein, for each server of the plurality of servers, the server is positioned within the respective rack unit such that the set of tabs of the bus bar at the respective rack unit contact a subset of the switches of the set of switches of the server to generate a signal by the server that indicates the location of the server within the server rack.

Other embodiments of these aspects include corresponding systems and apparatus.

These and other embodiments may each optionally include one or more of the following features. For instance, further including: a first server of the plurality of servers including a first set of switches; and the bus bar including a first set of tabs at a first rack unit of the plurality of rack units, the first set of tabs indicating the location of the first rack unit at the server rack, wherein the first server is positioned within the server rack such that the first set of tabs contacts the first set of switches to indicate the position of the first server at a first location of the first rack unit within the server rack, wherein the first server generates a signal to indicate the first location of the first server at the first rack unit. The first set of tabs contact the first set of switches to depress a subset of the first set of switches to indicate that the first server is located at the first position of the first rack unit within the server rack. One or more of the first set of tabs extend from the bus bar and the remaining tabs of the first set of tabs are retracted, with the combination of the extended tabs of the first set of tabs and the retracted tabs of the first set of tabs indicating the first location of the first rack unit within the server rack. The first set of tabs contact the first set of switches such that the extended tabs of the first set of tabs depress the subset of the first set of switches of the first server. The retracted tabs of the first set of tabs do not contact a corresponding switch of the first set of switches. A combination of the extended tabs of the first set of tabs and the retracted tabs of the first set of tabs at the first rack unit indicates the first location of the first rack unit within the server rack. Further including: a second server of the plurality of servers including a second set of switches; and the bus bar including a second set of tabs at a second rack unit of the plurality of rack units, the second set of tabs indicating the location of the second rack unit at the server rack, wherein the second server is positioned within the server rack such that the second set of tabs contacts the second set of switches to indicate the position of the second server at a second location of the second rack unit within the server rack, wherein the second server generates a signal to indicate the second location of the second server at the second rack unit. The second set of tabs contact the second set of switches to depress a subset of the second set of switches to indicate that the second server is located at a second position of the second rack unit within the server rack. One or more of the second set of tabs extend from the bus bar and the remaining tabs of the second set of tabs are retracted, with the combination of the extended tabs of the second set of tabs and the retracted tabs of the second set of tabs indicating the second location of the second rack unit within the server rack. The second set of tabs contact the second set of switches such that the extended tabs of the second set of tabs depress the subset of the second set of switches of the second server. The retracted tabs of the second set of tabs do not contact a corresponding switch of the second set of switches. A second combination of the extended tabs of the second set of tabs and the retracted tabs of the second set of tabs at the second rack unit indicates the second location of the second rack unit within the server rack. The second combination differs from the first combination.

Particular implementations of the subject matter described in this specification can be implemented so as to realize one or more of the following advantages. For example, location information of servers within a server rack is provided.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
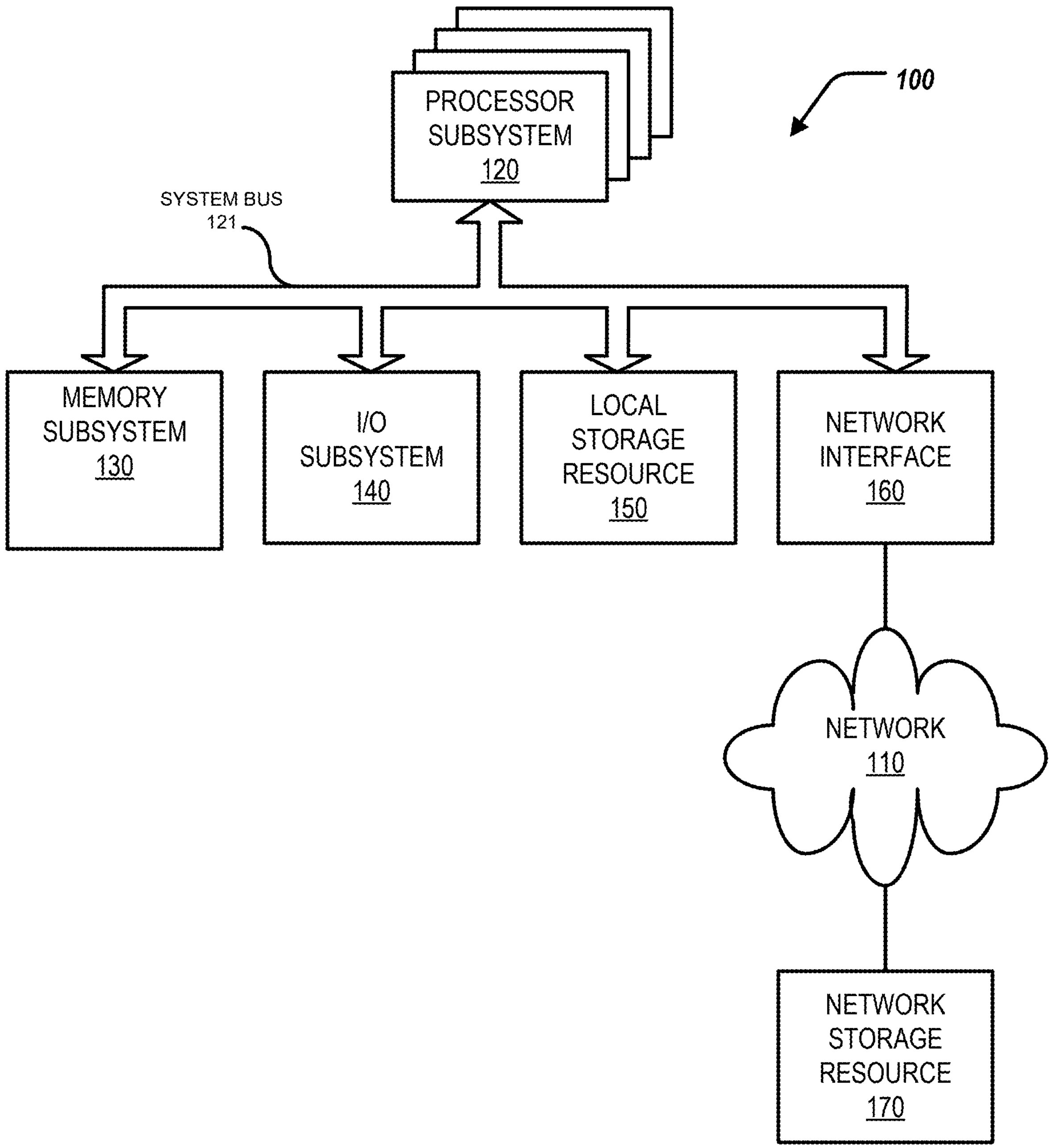
FIG. 1 is a block diagram of selected elements of an embodiment of an information handling system.

This disclosure discusses a server rack, and in particular, a server rack with server mating location. In short, a bus bar can include tabs at each rack unit such that when a server is engaged with the rack unit, the tabs can contact switches on the server to indicate a location of the server within the server rack—that is, the specific rack unit the server is engaged with, described further herein.

Specifically, this disclosure discusses a server rack including: a plurality of rack units; a plurality of servers, each server positioned within a respective rack unit of the plurality of rack units, each server including a first coupling mechanism, each server including a set of switches; a bus bar including, at each rack unit of the plurality of rack units: a second coupling mechanism for coupling with the first coupling mechanism of the server located at the rack unit; and a set of tabs, wherein a state of each of the tabs of the set of tabs indicates a location of the rack unit within the server rack, wherein, for each server of the plurality of servers, the server is positioned within the respective rack unit such that the set of tabs of the bus bar at the respective rack unit contact a subset of the switches of the set of switches of the server to generate a signal by the server that indicates the location of the server within the server rack.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such as wires, optical fibers, microwaves, radio waves, and other electromagnetic and/or optical carriers; and/or any combination of the foregoing.

Particular embodiments are best understood by reference to FIGS. 1-13 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include one or more processing resources such as a central processing unit (CPU), microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, a camera, or another type of peripheral device.

Local storage resource 150 may comprise computer-readable media (e.g., hard disk drive, floppy disk drive, CD-ROM, and/or other types of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other types of rotating storage media, flash memory, EEPROM, and/or other types of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g., corporate) network. The network may be implemented as, or may be a part of, a storage area network (SAN), a personal area network (PAN), a local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g., customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet, or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
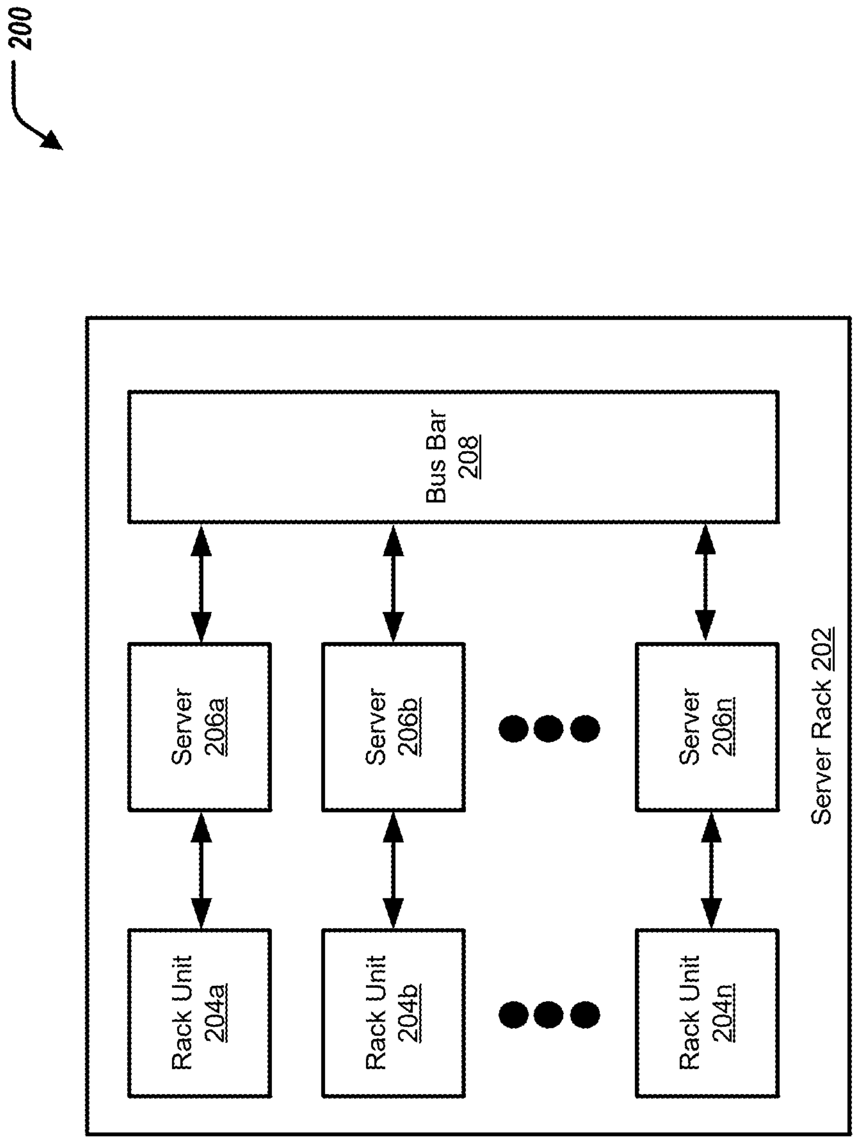
FIG. 2 illustrates a block diagram of a server rack.

Turning to FIG. 2, FIG. 2 illustrates a block diagram of an environment 200 including a server rack 202. The server rack 202 can include rack units 204*a*, 204*b*, . . . , 204*n* (collectively referred to as rack units 204); servers 206*a*, 206*b*, . . . , 206*n* (collectively referred as servers 206); and a bus bar 208. The servers 206 can be similar to, or include, the information handling system 100 of FIG. 1.

The servers 206 can be (physically) coupled to respective rack units 204. Further, each of the servers 206 can be coupled to the bus bar 208. In some examples, the bus bar 208 facilitates providing power to one or more of the servers 206.

Figure 3:
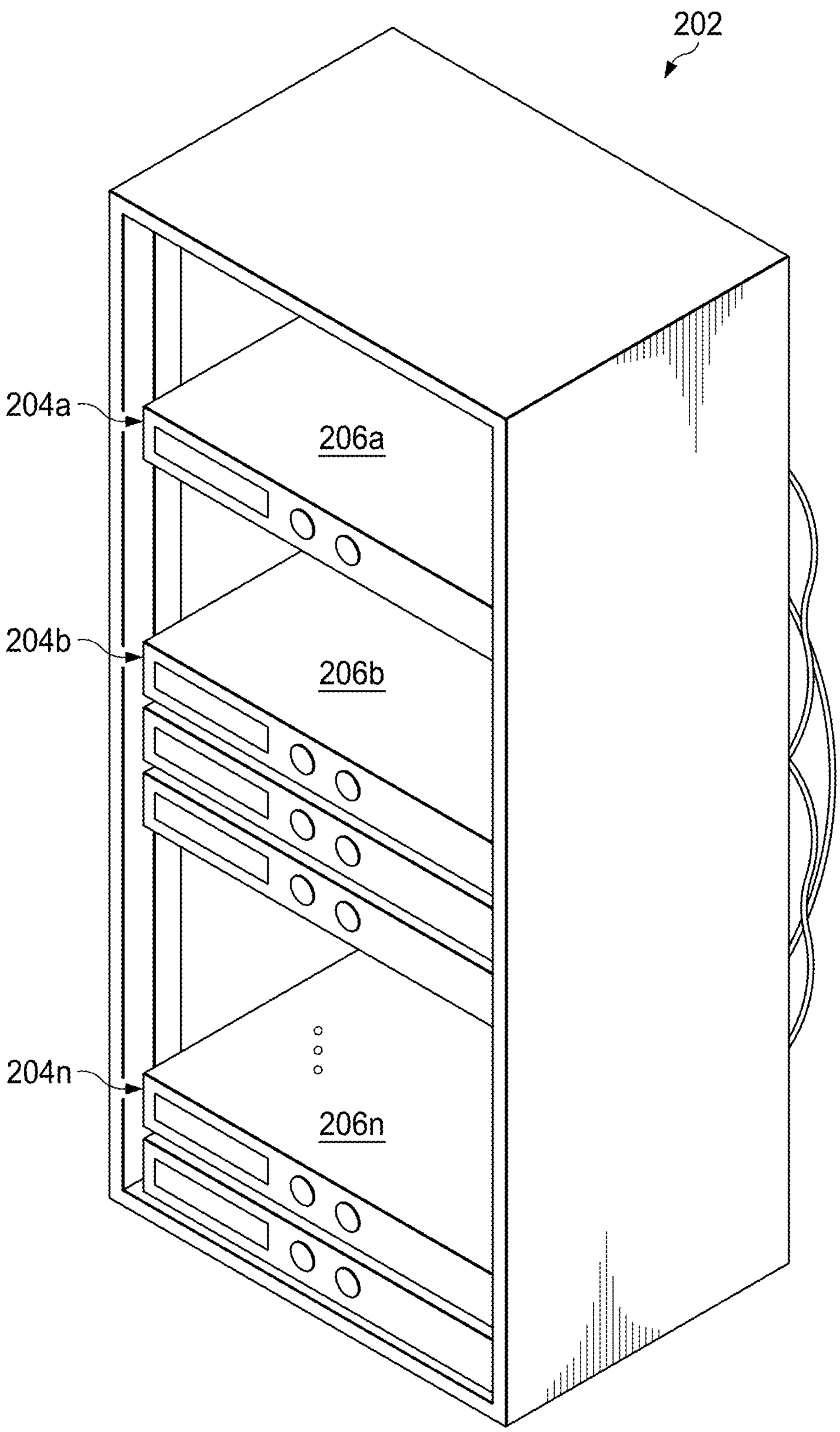
FIG. 3 illustrates a perspective view of the server rack.

FIG. 3 illustrates a perspective view of the server rack 202. The server rack 202 includes the rack units 204, with servers 206 positioned at respective rack units 204. In other words, the servers 206 are physically coupled to the respective rack units 204. In other words, the servers 206 are physically coupled to the server rack 202 at respective rack units 204. In other words, the servers 206 are positioned within a respective rack unit 204. For example, a first server 206*a* is positioned within the rack unit 204*a*; and a second server 206*b* is positioned within the rack unit 204*b*.

In short, the bus bar 208 can include tabs at each of the rack units 204 such that when a server 206 is engaged with the rack unit 204, the tabs can contact switches on the server 206 to indicate a location of the server 206 within the server rack—that is, the specific rack unit 204 the server 206 is engaged with, described further herein.

Figure 4:
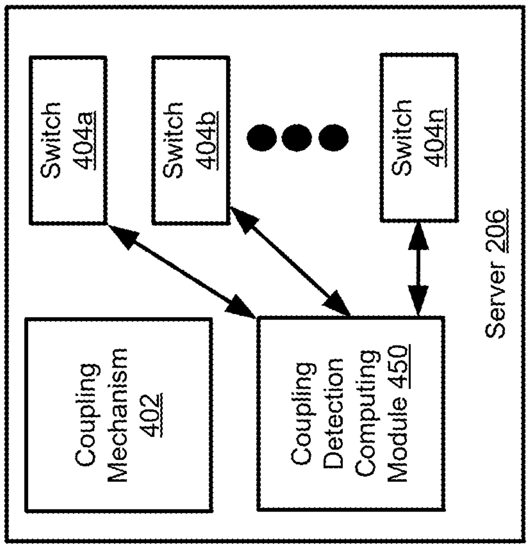
FIG. 4 illustrates a block diagram of a server.
Figure 5:
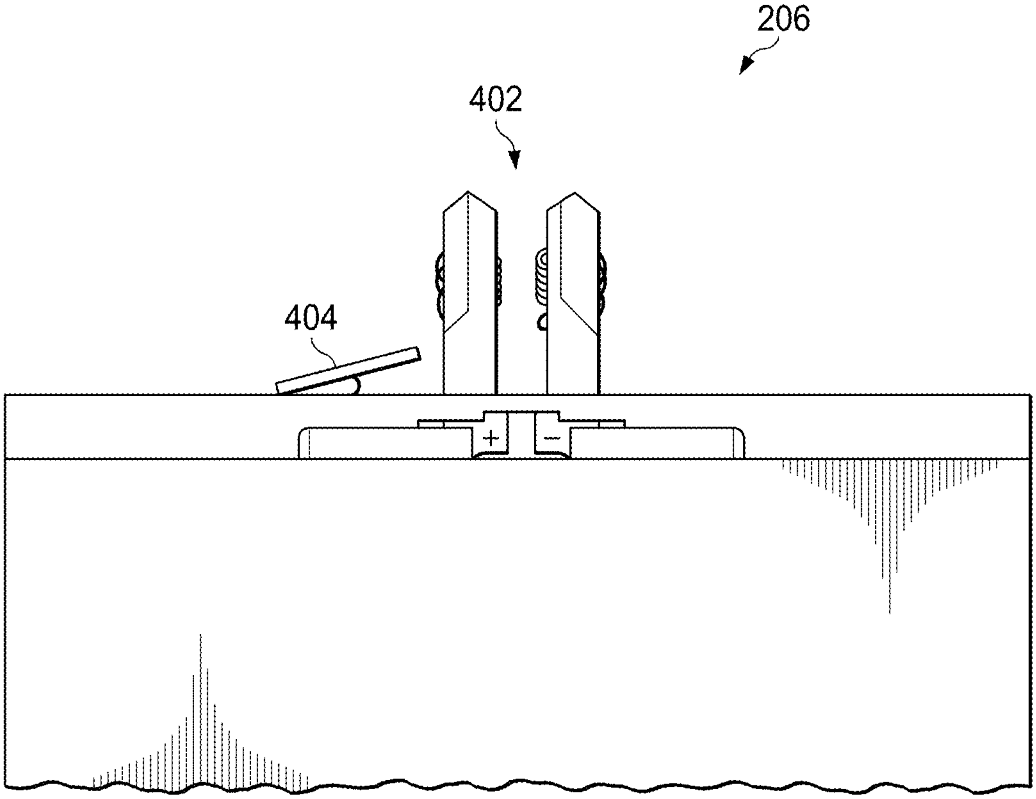
FIG. 5 illustrates a top-down view of a back portion of the server.

FIG. 4 illustrates a block diagram of the server 206, and FIG. 5 illustrates a top-down view of a back portion of the server 206. The server 206 can include a first coupling mechanism 402 and a set of switches 404*a*, 404*b*, . . . , 404*n* (collectively referred to as switches 404). The server 206 can include any number of switches 404 (e.g., one, two, five, or more). The first coupling mechanism 402 can include a power clip. The server 206 can further include a coupling detection computing module 450. The coupling detection computing module 450 can be in communication with each of the switches 404. The coupling detection computing module 450 can detect activation, depression, contact and the like of the switches 404.

Figure 6:
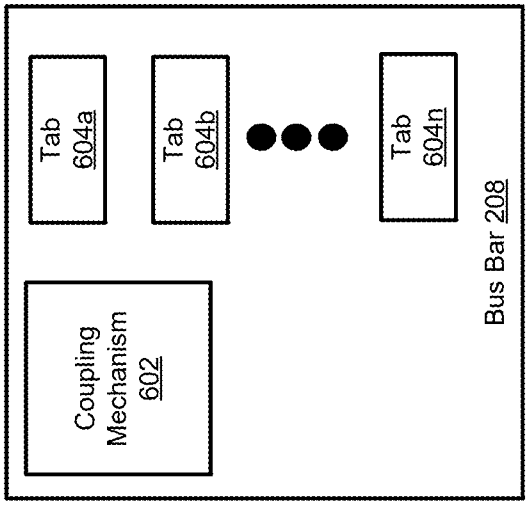
FIG. 6 illustrates a block diagram of a bus bar.
Figure 7:
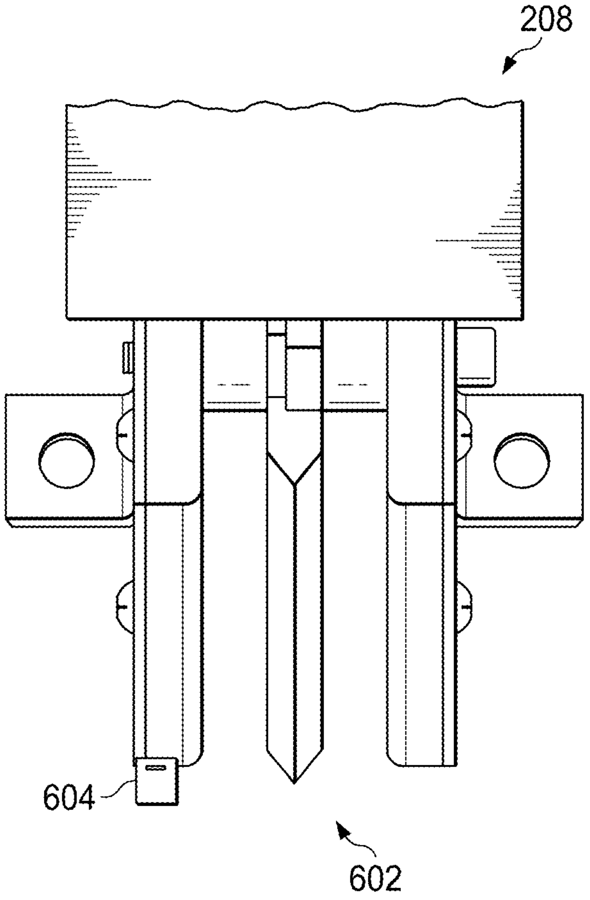
FIG. 7 illustrates a top-down view of a back portion of the bus bar.

FIG. 6 illustrates a block diagram of the bus bar 208, and FIG. 7 illustrates a top-down view of a back portion of the bus bar 208. The bus bar 208 can include a second coupling mechanism 602 and a set of tabs 604*a*, 604*b*, . . . , 604*n* (collectively referred to as tabs 604). The bus bar 208 can include any number of tabs 604 (e.g., one, two, five, or more). The tabs 604 can indicate a location of a particular rack unit 204 within the server rack 202. For example, a state of the tabs 604 can indicate the location of the particular rack unit 204 within the server rack 202, described further herein. The second coupling mechanism 602 can couple with the first coupling mechanism 402 to facilitate coupling between the server 206 and the bus bar 208, described further herein.

Figure 8:
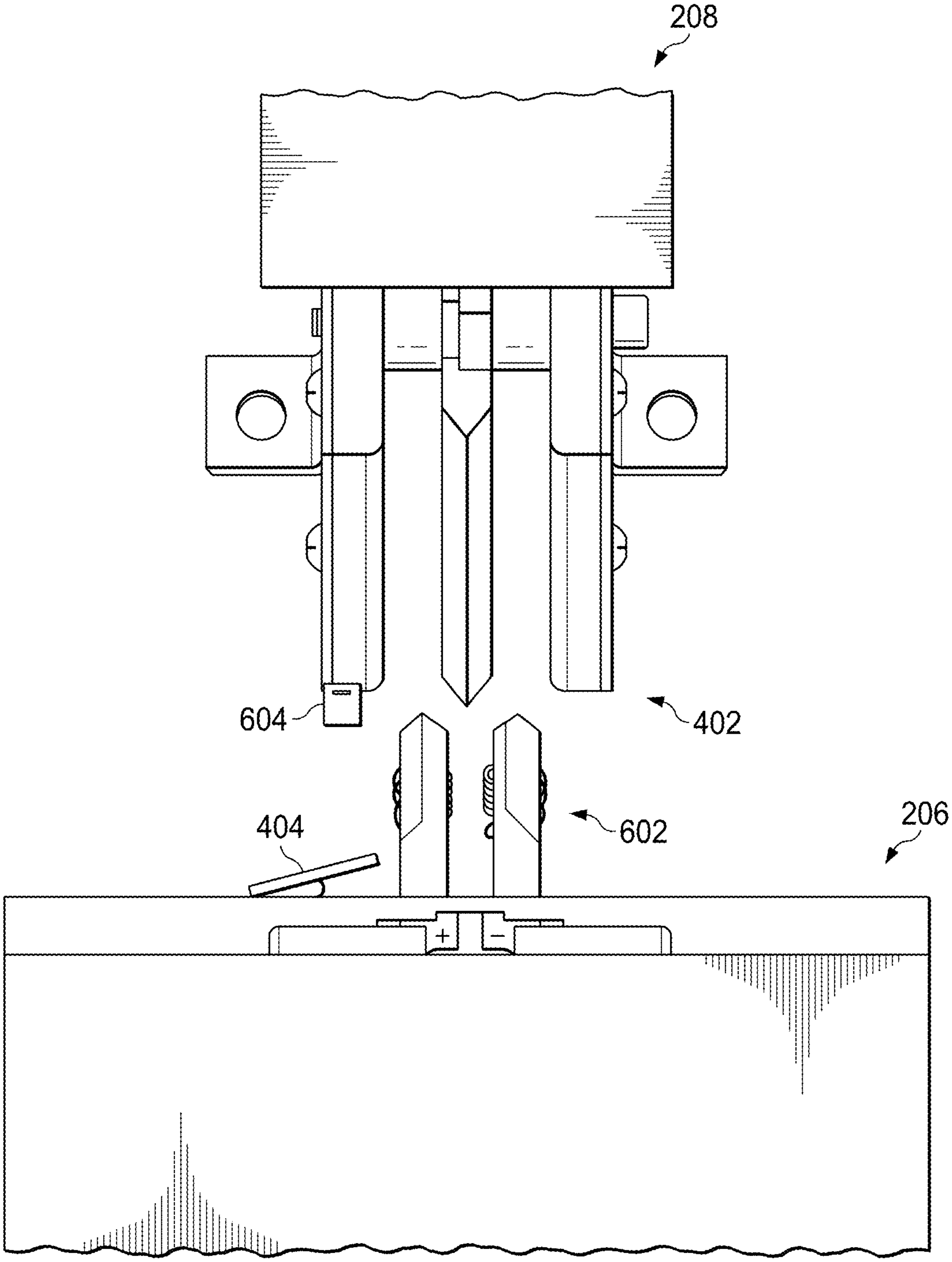
FIG. 8 illustrates a top-down view of the server decoupled from the bus bar.

FIG. 8 illustrates a top-down view of the server 206 decoupled (disengaged) from the bus bar 208; that is, prior to coupling between the server 206 and the bus bar 208 at a particular rack unit 204 of the server rack 202. In particular, the server 206 is decoupled (disengaged) from the bus bar 208 such that the tab 604 does not contact (engage) the switch 404.

Figure 9:
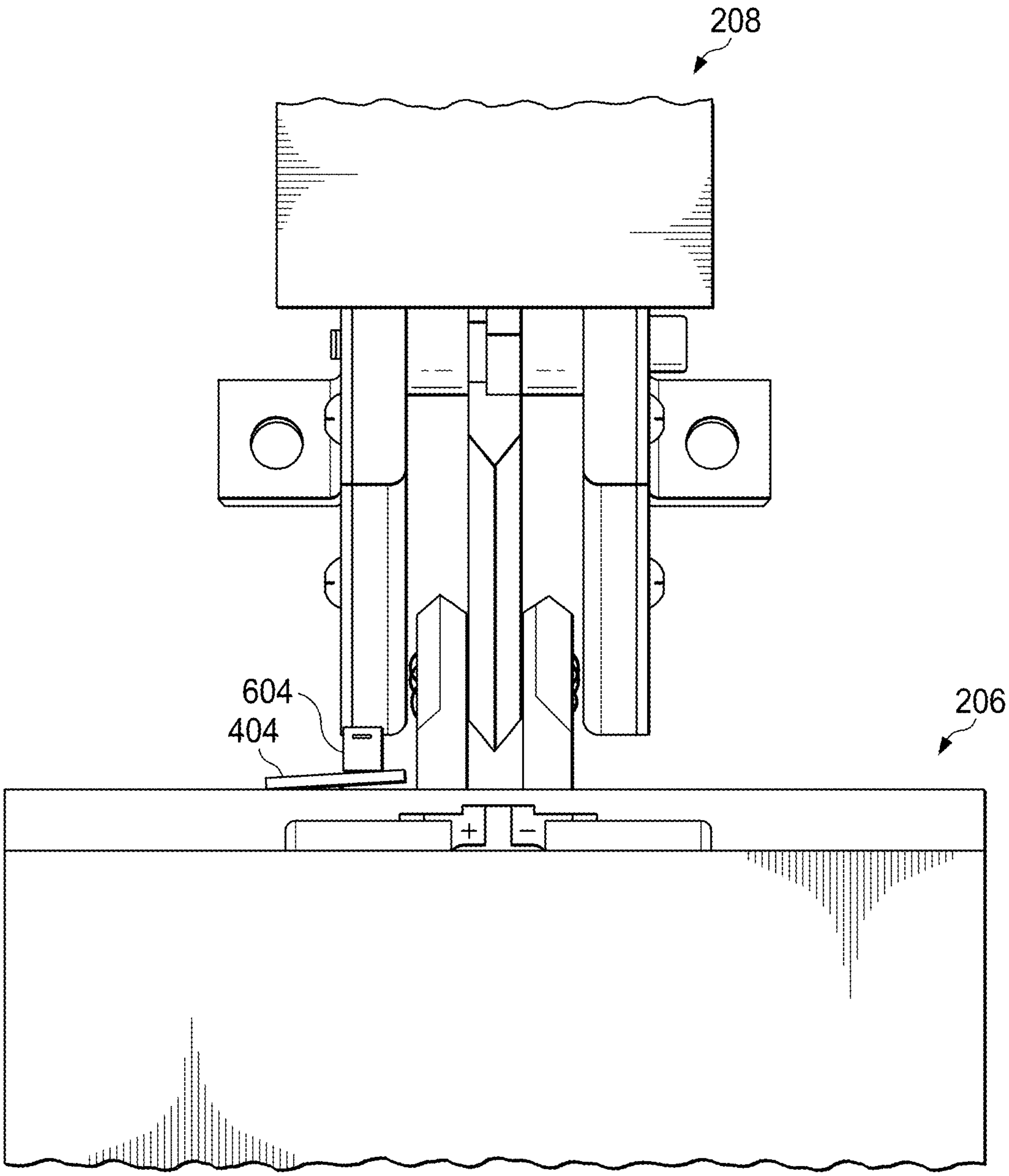
FIG. 9 illustrates a top-down view of the server coupled with the bus bar.

FIG. 9 illustrates a top-down view of the server 206 coupled (engaged) with the bus bar 208; that is, after coupling between the server 206 and the bus bar 208 at a particular rack unit 204 of the server rack 202. In particular, the server 206 is coupled with (engaged) with the bus bar 208 such that the tab 604 contacts (engages) the switch 404. When the tab 604 engages a corresponding switch 404, the switch 404 transitions from a first state (as shown in FIG. 8) to a second state (as shown in FIG. 9). In other words, the tab 604 engages with the corresponding switch 404 to activate (or "turn on") the switch 404.

Figure 10:
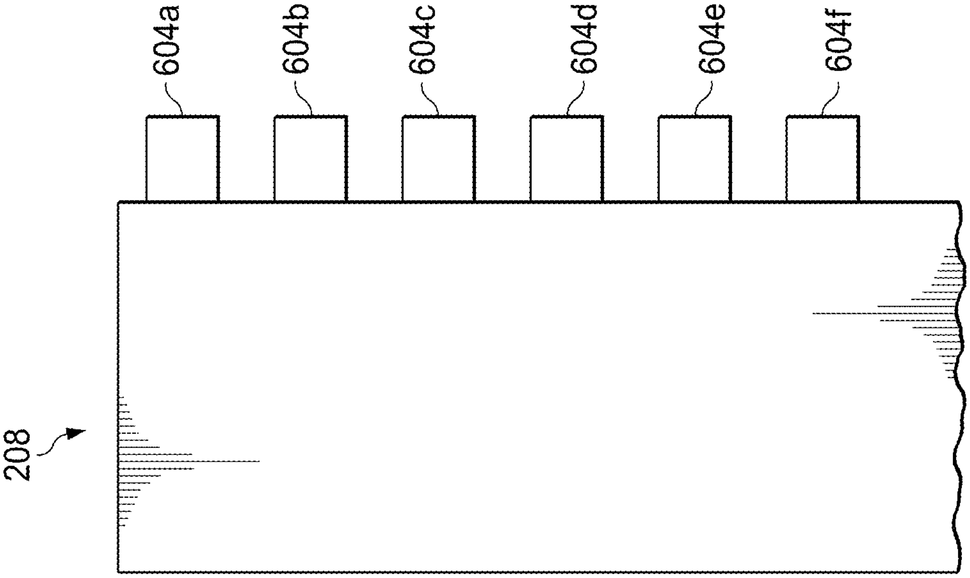
FIG. 10 illustrates tabs of the bus bar, in a first example.
Figure 11:
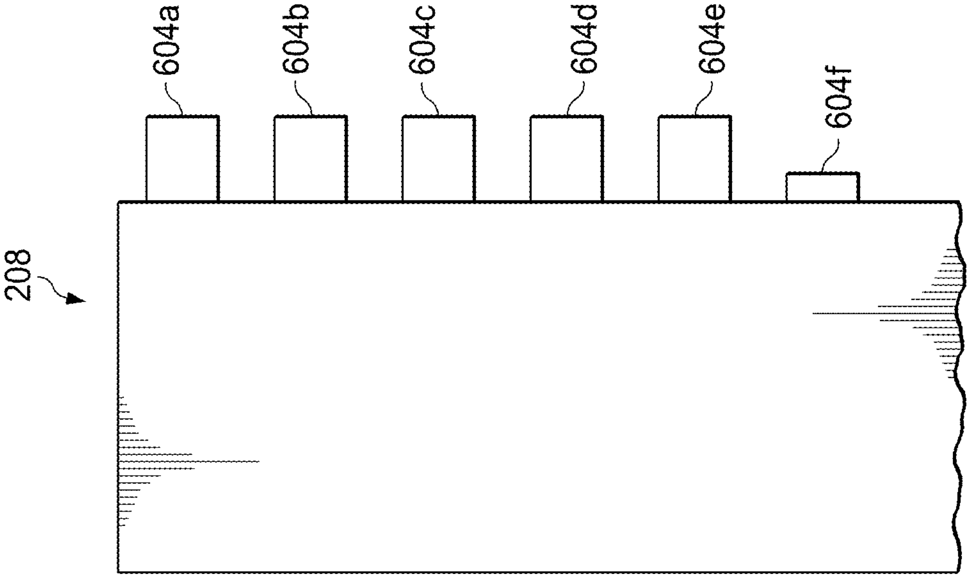
FIG. 11 illustrates tabs of the bus bar, in a second example.

FIG. 10 illustrates a simplified side view of a portion of the bus bar 208, in a first example, and FIG. 11 illustrates a simplified side view of a portion of the bus bar 208, in a second example. The bus bar 208 can include the set of tabs 604, shown as tabs 604*a*, 604*b*, 604*c*, 604*d*, 604*e*, 604*f*, however, the bus bar 208 can include any number of tabs 604. Each of the tabs 604 can be associated with a physical state—extended or retracted. As shown in FIG. 10, each of the tabs 604 are in the extended state; and as shown in FIG. 11, the tabs 604*a*-604*e* are in the extended state, and the tab 604*f* is in the retracted state. The tabs 604 can be in any combination of extended and retracted states.

The bus bar 208 can include tabs 604 for each rack unit 204. That is, for each rack unit 204 of the server rack 202, the bus bar 208 can include a corresponding set of tabs 604. The set of tabs 604 at the rack unit 204 are associated with the rack unit 204, and specifically, are associated with the location of the rack unit 204 within the server rack 202 (with respect to the server rack 202). That is, at each rack unit 204, the bus bar 208 can include a corresponding set of tabs 604. Each rack unit 204 can be associated with a specific set of tabs 604 of the bus bar 208, with each rack unit 204 associated with a differing set of tabs 604.

To that end, the specific combination of extended states and retracted states of the set of tabs 604 can indicate a specific rack unit 204, and in particular, the location of the rack unit 204 within the server rack 202. That is, each rack unit 204 can be associated with a differing combination of extended states and retracted states of the set of tabs 604 that is associated with the rack unit 204. By each rack unit 204 associated with a set of tabs 604 that differs in extended state and retracted state combination as compared to the set of tabs for each other rack unit 204, the specific location of the rack unit 204 can be encoded by and indicated by the set of tabs for the rack unit 204.

For example, when the bus bar 208 includes six tabs 604, the set of tabs 604 can include up to sixty-four unique combinations of extended and retracted states. Thus, when the bus bar 208 includes six tabs 604, the set of tabs 604 can indicate sixty-four unique rack units 204 within the server rack 202 and sixty-four unique locations for each of the rack units 204.

To that end, for each server 206, the server 206 is positioned within (physically coupled to) the respective rack unit 204 such that the tabs 604 of the bus bar 208 that are associated with (correspond to) the respective rack unit 204 contact a subset of the switches 404 of the server 206. That is, when the server 206 is coupled (physically connected) with the rack unit 204, a subset of the tabs 604 of the bus bar 208 that correspond to the rack unit 204 can contact a subset of the switches 404 of the server 206. Specifically, when the server 206 is coupled with the rack unit 204, the tabs 604 that are extended (extended tabs) that correspond to the rack unit 204 contact corresponding switches 404 of the server 206, with the tabs 604 that are retracted (retracted tabs) that correspond to the rack unit 204 not contacting corresponding switches 404 of the server 206.

The unique combination of extended tabs and retracted tabs of the tabs 604 for the rack unit 204 can contact the switches 404 of the server 206 in a corresponding unique combination, providing an indication of the location of the rack unit 204, and thus, the server 206, within the server rack 202. The server 206 (e.g., the coupling detection computing module 450) can detect the unique combination of activated switches 404 (switches 404 that are contacted by extended tabs 604) to identify the location of the rack unit 204 that the server 206 is coupled to, and thus, identify the location of the server 206 with respect to the server rack 202. The server 206 can generate a signal that indicates the location of the server 206 with respect to the server rack 202 (location of the rack unit 204 the server 206 is coupled to). For example, the server 206 (e.g., the coupling detection computing module 450) can generate a signal to indicate a message on a display device coupled to the server rack 202 or a display device at the server 206 that indicates the location of the server 206 at the server rack 202.

In some examples, the number of switches 404 can correspond to the number of tabs 606 (e.g., the same number of switches 404 and tabs 606). In some examples, the number of switches 404 can be greater than the number of tabs 606. In some examples, the number of switches 404 is less than the number of tabs 606.

Figure 12:
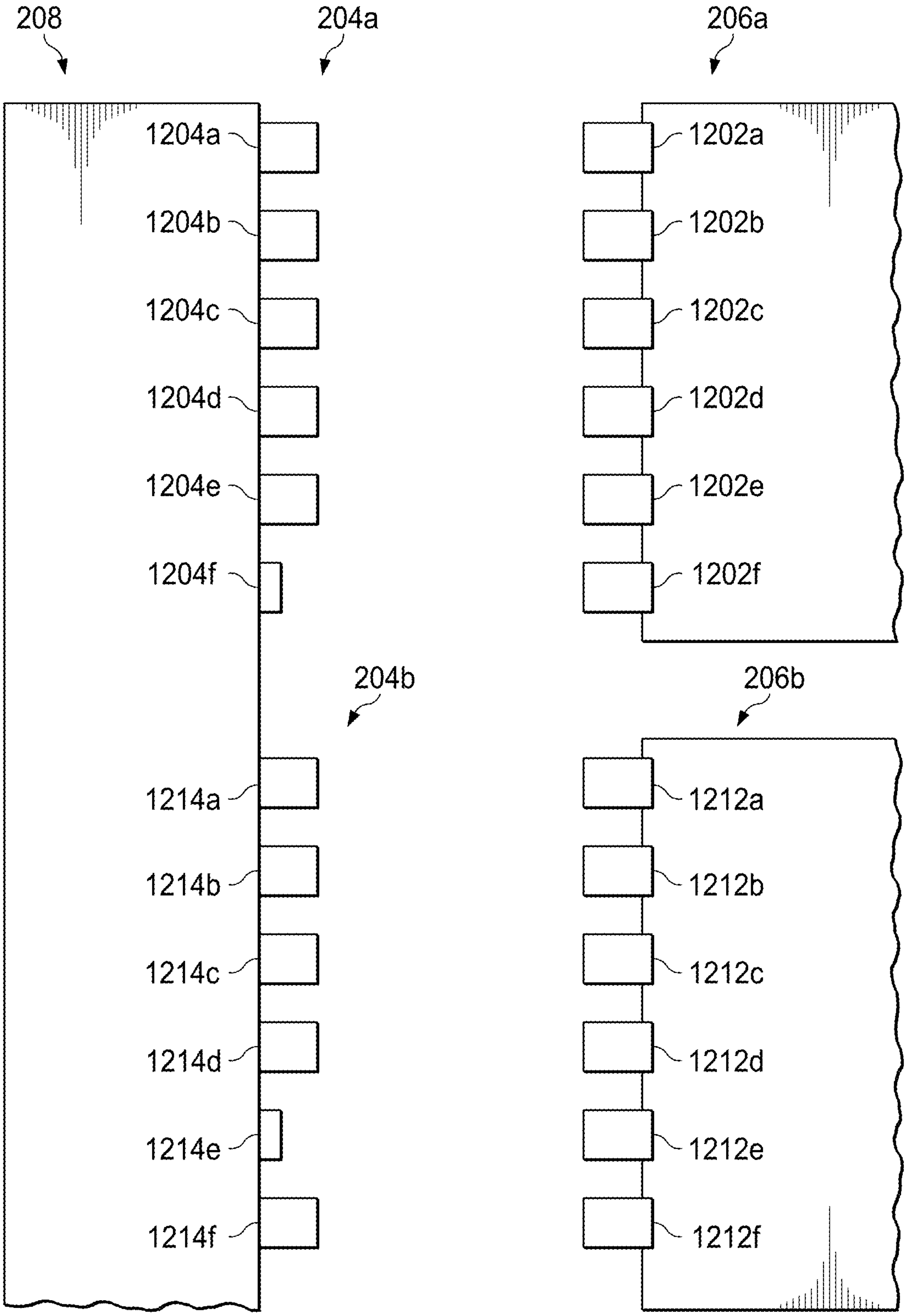
FIG. 12 illustrates a side view of two servers decoupled from the bus bar.

FIG. 12 illustrates a simplified view of a first server 206*a* proximate to the bus bar 208 at a first rack unit 204*a*, and a second server 206*b* proximate to the bus bar 208 at a second rack unit 204*b*. For simplicity of illustration, the first coupling mechanisms 402 of the first server 206*a*, second server 206*b* and the second computing mechanisms 602 of the bus bar 208 are not shown. The first server 206*a* can include a first set of switches 1202, and the second server 206*b* can include a second set of switches 1212. The bus bar 208 can include a first set of tabs 1204 at the first rack unit 204*a*. Specifically, the tabs 1204*a*-1204*e* can be extended, and the tab 1204*f* can be retracted. The tabs 1204 can indicate the first location of the first rack unit 204*a*. That is, the unique combination of the tabs 1204*a*-1204*e* being extended and the tab 1204*f* being retracted can identify the first location of the first rack unit 204*a*. Further, the bus bar 208 can include a second set of tabs 1214 at the second rack unit 204*b*. Specifically, the tabs 1214*a*-1214*d*, 1214*f* can be extended, and the tab 1214*e* can be retracted. The tabs 1214 can indicate the second location of the second rack unit 204*b*. That is, the unique combination of the tabs 1214*a*-1214*d*, 1214*f* being extended and the tab 1214*e* being retracted can identify the second location of the second rack unit 204*b*.

Figure 13:
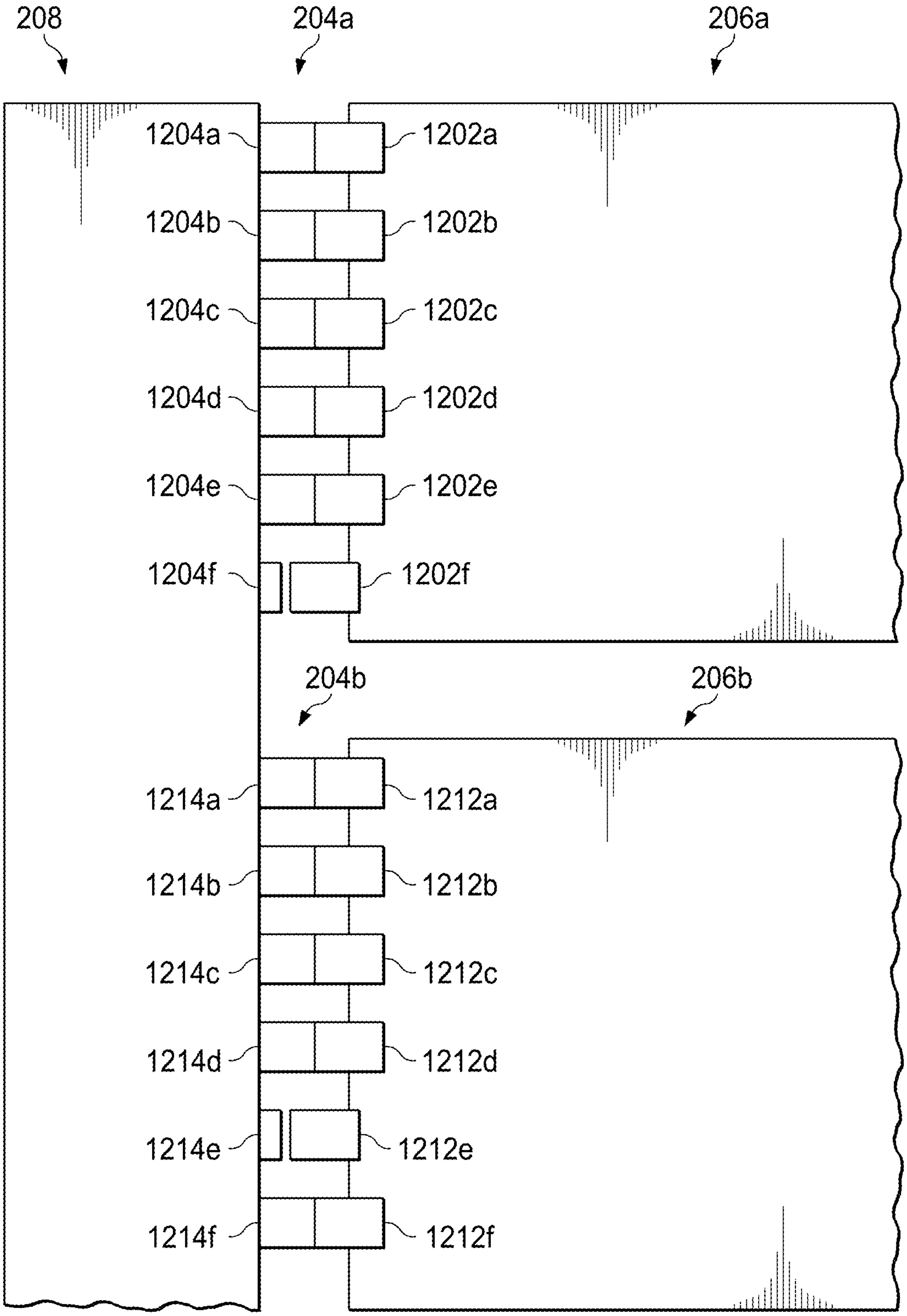
FIG. 13 illustrates a side view of two servers coupled with the bus bar.

FIG. 13 illustrates a simplified view of the first server 206*a* coupled with the bus bar 208 at the first rack unit 204*a*, and the second server 206*b* coupled with the bus bar 208 at the second rack unit 204*b*. Specifically, the first server 206*a* is positioned within the server rack 202 such that the first set of tabs 1204 contacts the first set of switches 1202 to indicate the position of the first server 206*a* at the first location of the first rack unit 204*a* within the server rack 202. The first set of tabs 1204 contact the first set of switches 1202 to depress a subset of the first set of switches 1202 to indicate that the first server 206*a* is located at the first position of the first rack unit 204*a* within the server rack 202. For example, the tabs 1204*a*-1204*e* depress the switches 1202*a*-1202*e* when the first server 206*a* is coupled to the server rack 202, and is positioned within the first rack unit 204*a*. Similarly, the tab 1202*f* does not contact the switch 1204*f*. To that end, the combination of the extended tabs (tabs 1204*a*-1204*e*) and the retracted tabs (tab 1202*f*) indicates the first location of the first rack unit 204*a* within the server rack 202.

Further, in response to the tabs 1204*a*-1204*e* depressing the switches 1202*a*-1202*e*, the first server 206*a*, and in particular, the coupling detection computing module 450, detects the depression of the switches 1202*a*-1202*e*. The first server 206*a*, based on the detection of the depression of the switches 1202*a*-1202*e*, can determine the location of the first server 206*a* with respect to the server rack 202 (location of the first rack unit 204*a* the first server 206*a* is coupled to) based on the combination of the switches 1202 that are depressed (switches 1202*a*-1202*e*). The first server 206*a* (e.g., the coupling detection computing module 450) can generate a signal to indicate a message on a display device coupled to the server rack 202 or a display device at the first server 206*a* indicating the first location of the first server 206*a* at the server rack 202.

Moreover, the second server 206*b* is positioned within the server rack 202 such that the second set of tabs 1214 contacts the second set of switches 1212 to indicate the position of the second server 206*b* at a second location of the second rack unit 204*b* within the server rack 202. The second set of tabs 1214 contact the second set of switches 1212 to depress a subset of the second set of switches 1212 to indicate that the second server 206*b* is located at the second position of the second rack unit 204*b* within the server rack 202. For example, the tabs 1214*a*-1214*d*, 1214*f* depress the switches 1212*a*-1212*d*, 1212*f* when the second server 206*b* is coupled to the server rack 202, and positioned within the second rack unit 204*b*. Similarly, the tab 1214*e* does not contact the switch 1212*e*. To that end, the combination of the extended tabs (tabs 1214*a*-1214*d*, 1214*f*) and the retracted tabs (tab 1214*e*) indicates the second location of the second rack unit 204*b* within the server rack 202.

Further, in response to the tabs 1214*a*-1214*d*, 1214*f* depressing the switches 1212*a*-1212*d*, 1212*f*, the second server 206*b*, and in particular, the coupling detection computing module 450, detects the depression of the switches 1212*a*-1212*d*, 1212*f*. The second server 206*b*, based on the detection of the depression of the switches 1212*a*-1212*d*, 1212*f*, can determine the location of the second server 206*b* with respect to the server rack 202 (location of the second rack unit 204*b* the second server 206*b* is coupled to) based on the combination of the switches 1212 that are depressed (switches 1212*a*-1212*d*, 1212*f*). The second server 206*b* (e.g., the coupling detection computing module 450) can generate a signal to indicate a message on a display device coupled to the server rack 202 or a display device at the second server 206*b* indicating the second location of the second server 206*b* at the server rack 202.

In some examples, the combination of switches 1202 that are depressed differs from the combination of switches 1212 that are depressed. For example, the switches 1202*a*-1202*e* of the first server 206*a* (first combination) differs from the switches 1212*a*-1212*d*, 1212*f* of the second server 206*b* (second combination) that are depressed.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

What is claimed is:

1. A server rack including:

a plurality of rack units;

a plurality of servers, each server positioned within a respective rack unit of the plurality of rack units, each server including a first coupling mechanism, each server including a set of switches, including a first server including a first set of switches;

a bus bar including, at each rack unit of the plurality of rack units:

a second coupling mechanism for coupling with the first coupling mechanism of the server located at the rack unit; and a set of tabs, wherein a state of each of the tabs of the set of tabs indicates a location of the rack unit within the server rack, including a first set of tabs at a first rack unit, wherein one or more of the first set of tabs extend from the bus bar and the remaining tabs of the first set of tabs are retracted, with the combination of the extended tabs of the first set of tabs and the retracted tabs of the first set of tabs indicating a first location of the first rack unit within the server rack, wherein, for each server of the plurality of servers, the server is positioned within the respective rack unit such that the set of tabs of the bus bar at the respective rack unit contact a subset of the switches of the set of switches of the server to generate a signal by the server that indicates the location of the server within the server rack, including the first server positioned within the server rack such that the first set of tabs contacts the first set of switches to depress a subset of the first set of switches to indicate the first server at the first location of the first rack unit within the server rack and the first server generating a signal to indicate the first location of the first server at the first rack unit.

2. The server rack of claim 1, wherein the first set of tabs contact the first set of switches such that the extended tabs of the first set of tabs depress the subset of the first set of switches of the first server.

3. The server rack of claim 2, wherein the retracted tabs of the first set of tabs do not contact a corresponding switch of the first set of switches.

4. The server rack of claim 3, wherein a combination of the extended tabs of the first set of tabs and the retracted tabs of the first set of tabs at the first rack unit indicates the first location of the first rack unit within the server rack.

5. The server rack of claim 4, further including:

a second server of the plurality of servers including a second set of switches; and the bus bar including a second set of tabs at a second rack unit of the plurality of rack units, the second set of tabs indicating the location of the second rack unit at the server rack, wherein the second server is positioned within the server rack such that the second set of tabs contacts the second set of switches to indicate the position of the second server at a second location of the second rack unit within the server rack, wherein the second server generates a signal to indicate the second location of the second server at the second rack unit.

6. The server rack of claim 5, wherein the second set of tabs contact the second set of switches to depress a subset of the second set of switches to indicate that the second server is located at a second position of the second rack unit within the server rack.

7. The server rack of claim 6, wherein one or more of the second set of tabs extend from the bus bar and the remaining tabs of the second set of tabs are retracted, with the combination of the extended tabs of the second set of tabs and the retracted tabs of the second set of tabs indicating the second location of the second rack unit within the server rack.

8. The server rack of claim 7, wherein the second set of tabs contact the second set of switches such that the extended tabs of the second set of tabs depress the subset of the second set of switches of the second server.

9. The server rack of claim 8, wherein the retracted tabs of the second set of tabs do not contact a corresponding switch of the second set of switches.

10. The server rack of claim 9, wherein a second combination of the extended tabs of the second set of tabs and the retracted tabs of the second set of tabs at the second rack unit indicates the second location of the second rack unit within the server rack.

11. The server rack of claim 10, wherein the second combination differs from the first combination.

12. A server rack including:

a first rack unit;

a second rack unit;

a first server, the first server including a first set of switches;

a second server, the second server including a second set of switches;

a bus bar coupled to the first server and the second server, including:

a first set of tabs at the first rack unit, wherein one or more of the first set of tabs extend from the bus bar and the remaining tabs of the first set of tabs are retracted; and a second set of tabs at the second rack unit, one or more of the second set of tabs extend from the bus bar and the remaining tabs of the second set of tabs are retracted;

wherein the first server is positioned at the first rack unit such that the first set of tabs of the bus bar contact a subset of the first set of switches of the first server to indicate a first location of the first rack unit within the server rack, with the combination of the extended tabs of the first set of tabs and the retracted tabs of the first set of tabs indicating the first location of the first rack unit within the server rack, wherein the second server is positioned at the second rack unit such that the second set of tabs of the bus bar contact a subset of the second set of switches of the second server to indicate a second location of the second rack unit within the server rack, with the combination of the extended tabs of the second set of tabs and the retracted tabs of the second set of tabs indicating the second location of the second rack unit within the server rack.

13. The server rack of claim 12, wherein the first set of tabs contact the first set of switches such that the extended tabs of the first set of tabs depress the subset of the first set of switches of the first server, and the second set of tabs contact the second set of switches such that the extended tabs of the second set of tabs depress the subset of the second set of switches of the first server.

14. The server rack of claim 13, wherein the retracted tabs of the first set of tabs do not contact a corresponding switch of the first set of switches, and the retracted tabs of the second set of tabs do not contact a corresponding switch of the second set of switches.

15. The server rack of claim 14, wherein a first combination of the extended tabs of the first set of tabs and the retracted tabs of the first set of tabs at the first rack unit indicates the first location of the first rack unit within the server rack, and a first combination of the extended tabs of the second set of tabs and the retracted tabs of the second set of tabs at the second rack unit indicates the second location of the second rack unit within the server rack, wherein the second combination differs from the first combination.

* * * * *